United States Patent
Nakabayashi et al.

(10) Patent No.: US 7,787,221 B2
(45) Date of Patent: Aug. 31, 2010

(54) TUNNELING MAGNETIC SENSING ELEMENT INCLUDING NON-MAGNETIC METAL LAYER BETWEEN MAGNETIC LAYERS

(75) Inventors: Ryo Nakabayashi, Niigaka-ken (JP); Kazumasa Nishimura, Niigata-ken (JP); Yosuke Ide, Niigata-ken (JP); Yoshihiro Nishiyama, Niigata-ken (JP); Hidekazu Kobayashi, Niigata-ken (JP); Masamichi Saito, Niigata-ken (JP); Naoya Hasegawa, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 746 days.

(21) Appl. No.: 11/671,756

(22) Filed: Feb. 6, 2007

(65) Prior Publication Data
US 2008/0158738 A1    Jul. 3, 2008

(30) Foreign Application Priority Data
Dec. 28, 2006   (JP)   ............................. 2006-354993

(51) Int. Cl.
*G11B 5/33* (2006.01)
(52) U.S. Cl. .................................................. 360/324.2
(58) Field of Classification Search ................. 360/324, 360/324.1, 324.11, 324.12, 324.2
See application file for complete search history.

(56) References Cited

U.S. PATENT DOCUMENTS

| 6,275,363 | B1 * | 8/2001 | Gill ........................... 360/324.2 |
| 6,862,158 | B2 * | 3/2005 | Hasegawa et al. ....... 360/324.11 |
| 6,956,764 | B2 * | 10/2005 | Engel et al. .................. 365/158 |
| 7,256,971 | B2 * | 8/2007 | Horng et al. ............ 360/324.11 |
| 7,280,389 | B2 * | 10/2007 | Guo ............................ 365/158 |
| 7,423,848 | B2 * | 9/2008 | Horng et al. .............. 360/324.1 |
| 2007/0139827 | A1 * | 6/2007 | Gao et al. ................. 360/324.2 |

FOREIGN PATENT DOCUMENTS

| JP | 2005-260226 | 9/2005 |
| JP | 2005-286340 | 10/2005 |

* cited by examiner

*Primary Examiner*—Angel A. Castro
(74) *Attorney, Agent, or Firm*—Brinks Hofer Gilsn & Lione

(57) ABSTRACT

A first pinned magnetic sublayer 4a has a multilayered structure including a first insertion subsublayer disposed between a lower ferromagnetic subsublayer and an upper ferromagnetic subsublayer. The first insertion subsublayer has an average thickness exceeding 3 Å and 6 Å or less. This results in an interlayer coupling magnetic field Hin lower than a known art while RA and the rate of resistance change (ΔR/R) substantially identical to those of the known structure are maintained.

2 Claims, 7 Drawing Sheets

TUNNELING MAGNETIC SENSING ELEMENT INCLUDING NON-MAGNETIC METAL LAYER BETWEEN MAGNETIC LAYERS

This application claims the benefit of priority under 35 U.S.C. §119 to Japanese Patent Application No. 2006-354993, filed Dec. 28, 2006, which is hereby incorporated by reference in its entirety.

BACKGROUND OF THE INVENTION

1. Field of the Invention

The present invention relates to magnetic sensing elements utilizing the tunneling effect and incorporated in, for example, hard disk drives and other magnetic sensing devices. In particular, the present invention relates to a tunneling magnetic sensing element having low variations in RA and the rate of resistance change ($\Delta R/R$) and having a low interlayer coupling magnetic field Hin.

2. Description of the Related Art

Tunneling magnetic sensing elements (tunneling magnetoresistive (TMR) elements) change their resistance utilizing the tunneling effect. When the magnetization direction of a pinned magnetic layer is antiparallel to that of a free magnetic layer, a tunneling current does not easily flow through an insulating barrier layer (tunnel barrier layer) between the pinned magnetic layer and the free magnetic layer; hence, the resistance is maximized. On the other hand, when the magnetization direction of the pinned magnetic layer is parallel to that of the free magnetic layer, the tunneling current most easily flows; hence, the resistance is minimized.

A change in electrical resistance due to a change in the magnetization of the free magnetic layer affected by an external magnetic field is detected as a change in voltage on the basis of this principle to detect a leakage field from a recording medium.

Japanese Unexamined Patent Application Publication Nos. 2005-286340 (Patent Document 1) and 2005-260226 (Patent Document 2) are examples of related art.

The interlayer coupling magnetic field Hin acts between the free magnetic layer and the pinned magnetic layer. An increase in interlayer coupling magnetic field Hin results in a decrease in the magnetic sensitivity of the free magnetic layer and an increase in the asymmetry of a waveform when the element functions as a magnetic head. Thus, the element is designed so as to reduce the interlayer coupling magnetic field Hin.

For example, when a metal layer constituting the insulating barrier layer is subjected to oxidation treatment, the promotion of oxidation can reduce the interlayer coupling magnetic field Hin.

However, the employment of the technique disadvantageously increases RA (resistance R×element area A) of the tunneling magnetic sensing element. In this case, for example, the design value of the height of the tunneling magnetic sensing element (MRh) must be changed in order to bring RA within a predetermined range.

However, the change in the height of the element increases variations in the asymmetry of the waveform and reduces a signal-to-noise ratio. That is, the change in the height of the element cannot appropriately respond to an increase in recording density.

Accordingly, it is desirable that the interlayer coupling magnetic field Hin is reduced without redesign of the element while the variations in RA is small. In this case, it is desirable that the interlayer coupling magnetic field Hin is reduced while variations in the rate of resistance change ($\Delta R/R$) are also small.

In Patent Document 1 described above, a first pinned layer and a second pinned layer include a Cu sublayer or a Ta sublayer. However, the reason for the disposition of the Cu sublayer and the Ta sublayer is not apparent. In any case, Patent Document 1 discloses an invention for the stable application of an exchange bias magnetic field from a longitudinal bias layer disposed on the free magnetic layer to the free magnetic layer.

Patent Document 2 does not describe the tunneling magnetic sensing element. In Patent Document 2, an upper pinned layer includes an insertion sublayer for increasing interface scattering.

In Patent Documents 1 and 2, the problems with the tunneling magnetic sensing element are not recognized. That is, no means for solving the problems is described in Patent Documents 1 and 2.

SUMMARY OF THE INVENTION

Accordingly, to overcome the known problems, it is an object of the present invention to provide a tunneling magnetic sensing element having low variations in RA and the rate of resistance change ($\Delta R$) and having a low interlayer coupling magnetic field Hin.

A tunneling magnetic sensing element according to the present invention includes a lower magnetic layer; an insulating barrier layer; and an upper magnetic layer, disposed in that order from the bottom. One of the lower magnetic layer and the upper magnetic layer functions as a pinned magnetic layer, where the magnetization direction of the pinned magnetic layer is pinned, and the other functions as a free magnetic layer, and the magnetization direction of the free magnetic layer changes in response to an external magnetic field. The lower magnetic layer has a multilayered ferrimagnetic structure and includes a first magnetic sublayer, a nonmagnetic intermediate sublayer, and a second magnetic sublayer, disposed in that order from the bottom. The first magnetic sublayer has a multilayered structure and includes at least one first insertion sublayer composed of a nonmagnetic metal material and having an average thickness exceeding 3 Å and 6 Å or less, and includes ferromagnetic subsublayers, the first insertion subsublayer being disposed between the ferromagnetic subsublayer.

According to the present invention, the disposition of the first insertion subsublayer results in an interlayer coupling magnetic field Hin lower than that of the known structure that does not have the first insertion subsublayer, while RA and the rate of resistance change ($\Delta R/R$) substantially identical to those of the known structure are maintained. Furthermore, according to the present invention, it is possible to suppress variations in the asymmetry of a waveform, improve a signal-to-noise ratio, and appropriately respond to an increase in recording density.

According to the present invention, the first insertion subsublayer preferably has an average thickness of 4 Å to 5 Å. This suppresses the variations in RA, thus more effectively reducing the interlayer coupling magnetic field Hin.

According to the present invention, preferably, the at least one first insertion subsublayer is only a single subsublayer, and the average thickness of the ferromagnetic subsublayer disposed on the first insertion subsublayer is larger than the ferromagnetic subsublayer disposed under the first insertion subsublayer. Alternatively, the at least one first insertion subsublayer comprises a plurality of subsublayers, and the average thickness of the ferromagnetic subsublayer disposed on the uppermost first insertion subsublayer is larger than the ferromagnetic subsublayer disposed under the lowermost first insertion subsublayer. Thus, the first insertion subsublayer is remote from the insulating barrier layer, thereby reducing the effect of Ta on the insulating barrier layer.

According to the present invention, the first insertion subsublayer is preferably composed of at least one element selected from Ti, V, Zr, Nb, Mo, Hf, Ta, and W.

A tunneling magnetic sensing element according to the present invention includes a lower magnetic layer, an insulating barrier layer, and an upper magnetic layer, disposed in that order from the bottom. One of the lower magnetic layer and the upper magnetic layer functions as a pinned magnetic layer, the magnetization direction of the pinned magnetic layer being pinned, the other functions as a free magnetic layer, and the magnetization direction of the free magnetic layer changes in response to an external magnetic field, wherein the lower magnetic layer has a multilayered ferrimagnetic structure and includes a first magnetic sublayer, a nonmagnetic intermediate sublayer, and a second magnetic sublayer, disposed in that order from the bottom. Further, the second magnetic sublayer has a multilayered structure and includes at least one second insertion subsublayer composed of Ta and having an average thickness of 1 Å to 3 Å, and ferromagnetic subsublayers, the second insertion subsublayer being disposed between the ferromagnetic subsublayers.

According to the present invention, it is possible to achieve an interlayer coupling magnetic field Hin lower than that of the known structure that does not have the second insertion subsublayer, while RA and the rate of resistance change (ΔR/R) substantially identical to those of the known structure are maintained. Furthermore, according to the present invention, it is possible to suppress variations in the asymmetry of a waveform, improve a signal-to-noise ratio, and appropriately respond to an increase in recording density.

According to the present invention, preferably, the at least one second insertion subsublayer is only a single subsublayer, and the average thickness of the ferromagnetic subsublayer disposed on the second insertion subsublayer is larger than the ferromagnetic subsublayer disposed under the second insertion subsublayer. Alternatively, the at least one second insertion subsublayer comprises a plurality of subsublayers, and the average thickness of the ferromagnetic subsublayer disposed on the uppermost second insertion subsublayer is larger than the ferromagnetic subsublayer disposed under the lowermost second insertion subsublayer. Thus, the second insertion subsublayer is remote from the insulating barrier layer, thereby reducing the effect of Ta on the insulating barrier layer.

According to the present invention, preferably, the first magnetic sublayer has a multilayered structure and includes at least one third insertion subsublayer composed of a nonmagnetic metal material and having an average thickness of 1 Å to 3 Å, and ferromagnetic subsublayers, the at least one third insertion subsublayer being disposed between the ferromagnetic subsublayers. The disposition of the at least one third insertion subsublayer brings RA closer to RA of the known structure, thus reducing the variations in RA.

According to the present invention, preferably, the at least one third insertion subsublayer is only a single subsublayer, and the average thickness of the ferromagnetic subsublayer disposed on the third insertion subsublayer is larger than the ferromagnetic subsublayer disposed under the third insertion subsublayer. Alternatively, preferably, the at least one third insertion subsublayer comprises a plurality of subsublayers, and the average thickness of the ferromagnetic subsublayer disposed on the uppermost third insertion subsublayer is larger than the ferromagnetic subsublayer disposed under the lowermost third insertion subsublayer. Thus, the third insertion subsublayer is remote from the insulating barrier layer, thereby reducing the effect of Ta on the insulating barrier layer.

Furthermore, the third insertion subsublayer is preferably composed of at least one element selected from Ti, V, Zr, Nb, Mo, Hf, Ta, and W.

According to the present invention, the second insertion subsublayer preferably has an average thickness of 2 Å to 3 Å. Alternatively, the second insertion subsublayer and the third insertion subsublayer each have an average thickness of 2 Å to 3 Å. This suppresses the variations in RA, thus more effectively reducing the interlayer coupling magnetic field Hin.

According to the present invention, the insulating barrier layer is preferably composed of Ti—Mg—O, Ti—O, or Al—O.

According to the present invention, the lower magnetic layer functions as the pinned magnetic layer, and the upper magnetic layer functions as the free magnetic layer. In this case, preferably the ferromagnetic subsublayers are each composed of Co—Fe, the first insertion subsublayer and the third insertion subsublayer are each composed of Ta, and the first magnetic sublayer and/or the second magnetic sublayer has a multilayered structure of Co—Fe/Ta/Co—Fe. This increases the RKKY interaction between the first magnetic sublayer and the second magnetic sublayer and appropriately fixes in such a manner that the magnetization direction of the first magnetic sublayer is antiparallel to that of the second magnetic sublayer.

The tunneling magnetic sensing element according to the present invention has low variations in RA and the rate of resistance change (ΔR/R) and a low interlayer coupling magnetic field Hin.

DESCRIPTION OF THE PREFERRED EMBODIMENTS

Figure 1:
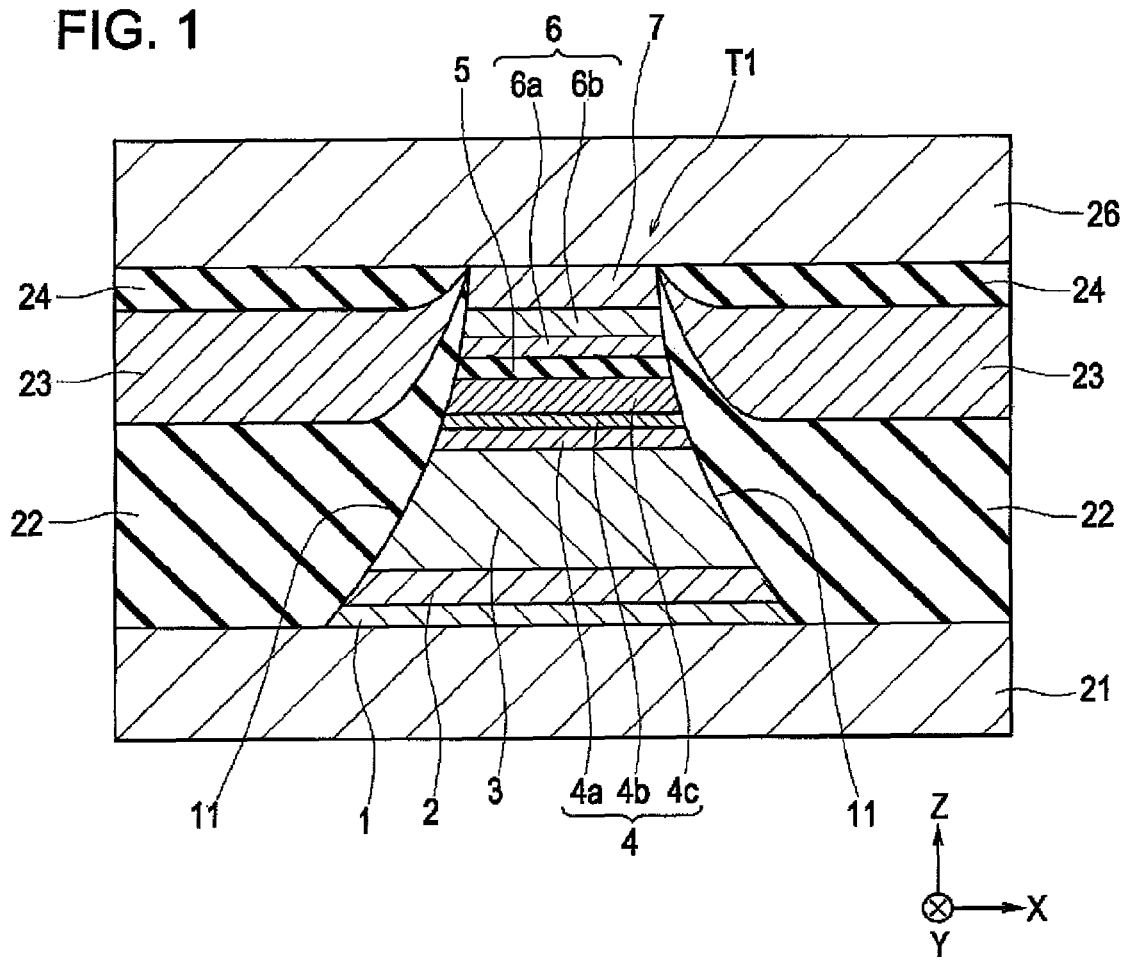
FIG. 1 is a cross-sectional view of a tunneling magnetic sensing element, the view being taken along a plane parallel to a face facing a recording medium.

FIG. 1 is a cross-sectional view of a tunneling magnetic sensing element, the view being taken along a plane parallel to a face facing a recording medium.

For example, the tunneling magnetic sensing element is mounted at a trailing end of a floating slider included in a hard disk system, and detects a magnetic leakage field (recording magnetic field) from a magnetic recording medium. In each drawing, the X direction indicates a track width direction. The Y direction indicates the direction of a magnetic leakage field from a magnetic recording medium (height direction). The Z direction indicates the direction of motion of a magnetic recording medium and also indicates the stacking direction of layers in the tunneling magnetic sensing element.

In FIG. 1, the lowermost layer is a bottom shield layer 21 composed of, for example, Ni—Fe. The bottom shield layer 21 is overlaid with a laminate T1. The tunneling magnetic sensing element includes the laminate T1, lower insulating layers 22, hard bias layers 23, and upper insulating layers 24, disposed on both sides of the laminate TI in the track width direction (X direction in the figure).

The lowermost layer of the laminate TI is an underlying layer 1 composed of at least one nonmagnetic element selected from Ta, Hf, Nb, Zr, Ti, Mo, and W. The underlying layer 1 is overlaid with a seed layer 2. The seed layer 2 is composed of Ni—Fe—Cr or Cr. The underlying layer 1 does not need to be disposed.

The seed layer 2 is overlaid with an antiferromagnetic layer 3. The antiferromagnetic layer 3 is preferably composed of an antiferromagnetic material containing an element X and Mn, the element X being at least one element selected from Pt, Pd, Ir, Rh, Ru, and Os.

Alternatively, the antiferromagnetic layer 3 may be composed of an antiferromagnetic material containing the element X, an element X', and Mn, the element X' being at least one element selected from Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb and rare-earth elements.

The antiferromagnetic layer 3 is composed of, for example, Ir—Mn.

The antiferromagnetic layer 3 is overlaid with a pinned magnetic layer (lower magnetic layer) 4. The pinned magnetic layer 4 has a multilayered ferrimagnetic structure including a first pinned magnetic sublayer (first magnetic sublayer) 4a, a nonmagnetic intermediate sublayer 4b, and a second pinned magnetic sublayer (second magnetic sublayer) 4c, disposed in that order from the bottom, The magnetization direction of the first pinned magnetic sublayer 4a is antiparallel to that of the second pinned magnetic sublayer 4c because of an exchange coupling magnetic field at the interface between the antiferromagnetic layer 3 and the pinned magnetic layer 4 and an antiferromagnetic exchange coupling magnetic field (RKKY interaction) via the nonmagnetic intermediate sublayer 4b. The multilayered ferrimagnetic structure of the pinned magnetic layer 4 can stabilize the magnetization of the pinned magnetic layer 4 and can apparently increase the exchange coupling magnetic field generated at the interface between the pinned magnetic layer 4 and the antiferromagnetic layer 3. The first pinned magnetic sublayer 4a and the second pinned magnetic sublayer 4c each have a thickness of about 12 Å to about 40 Å, The nonmagnetic intermediate sublayer 4b has a thickness of about 8 Å to about 10 Å.

The first pinned magnetic sublayer 4a and the second pinned magnetic sublayer 4c are each composed of a ferromagnetic material, for example, Co—Fe, Ni—Fe, or Co—Fe—Ni. The nonmagnetic intermediate sublayer 4b is composed of a nonmagnetic conductive material, for example, Ru, Rh, Ir, Cr, Re, or Cu.

The pinned magnetic layer 4 is overlaid with an insulating barrier layer 5 composed of Ti—Mg—O (titanium oxide-magnesium oxide. The Mg content is preferably 4 at % to 20 at %, the total content of Ti and Mg being 100 at %. This effectively increases rate of resistance change ($\Delta R/R$).

The insulating barrier layer 5 is overlaid with a free magnetic layer (upper magnetic layer) 6. The free magnetic layer 6 includes a soft magnetic sublayer 6b composed of a magnetic material such as a NiFe alloy, and an enhancing sublayer 6a disposed between the soft magnetic sublayer 6b and the insulating barrier layer 5, the enhancing sublayer 6a being composed of, for example, a Co—Fe alloy. The soft magnetic sublayer 6b is preferably composed of a magnetic material having satisfactory soft magnetic properties.

The enhancing sublayer 6a is preferably composed of a magnetic material having spin polarizability larger than that of the soft magnetic sublayer 6b. The enhancing sublayer 6a composed of a magnetic material, such as a Co—Fe alloy, having large spin polarizability improves the rate of resistance change ($\Delta R/R$).

The free magnetic layer 6 may be a multilayered ferrimagnetic structure including a plurality of magnetic sublayers with a nonmagnetic intermediate sublayer provided therebetween. A track width Tw is determined by the width of the free magnetic layer 6 in the track width direction (X direction in the figure).

The free magnetic layer 6 is overlaid with a protective layer 7 composed of, for example, Ta.

Both end faces 11 and 11 of the laminate TI in the track width direction (X direction in the figure) are inclined planes such that the width of the laminate T1 in the track width direction is gradually reduced with height.

As shown in FIG. 1, the lower insulating layers 22 are disposed on the bottom shield layer 21 that extends toward both sides of the laminate T1 and disposed on the end faces 11 and 11 of the laminate T1. The hard bias layers 23 are disposed on the lower insulating layers 22. Upper insulating layers 24 are disposed on the hard bias layers 23.

Bias underlying layers (not shown) may be disposed between the lower insulating layers 22 and the hard bias layers 23. The bias underlying layer is composed of, for example, Cr, W, or Ti.

The lower and upper insulating layers 22 and 24 are each composed of an insulating material, such as $Al_2O_3$ or $SiO_2$. The lower and upper insulating layers 22 and 24 insulate the hard bias layers 23 in such a manner that a current flowing through the laminate T1 in the direction perpendicular to interfaces between the layers is not diverted to both sides of the laminate Ti in the track width direction. The hard bias layers 23 are each composed of; for example, a Co—Pt (cobalt-platinum) alloy or a Co—Cr—Pt (cobalt-chromium-platinum) alloy.

The laminate T1 and the upper insulating layers 24 are overlaid with a top shield layer 26 composed of, for example, a NiFe alloy.

In the embodiment shown in FIG. 1, the bottom shield layer 21 and the top shield layer 26 each function as an electrode layer. A current flows in the direction perpendicular to surfaces of the layers of the laminate Ti (in the direction parallel to the Z direction in the figure).

A bias magnetic field from the hard bias layers 23 is applied to the free magnetic layer 6 to magnetize the free magnetic layer 6 in the direction parallel to the track width direction (X direction in the figure). On the other hand, the first pinned magnetic sublayer 4a and the second pinned magnetic sublayer 4c constituting the pinned magnetic layer 4 are magnetized in the direction parallel to the height direction (Y direction in the figure). Since the pinned magnetic layer 4 has a multilayered ferrimagnetic structure, the magnetization direction of the first pinned magnetic sublayer 4a is antiparallel to that of the second pinned magnetic sublayer 4e. The magnetization of the pinned magnetic layer 4 is pinned, i.e., the magnetization is not changed by an external magnetic field. The magnetization of the free magnetic layer 6 varies in response to the external magnetic field.

In the case where the magnetization of the free magnetic layer 6 is changed by the external magnetic field, when the magnetization direction of the second pinned magnetic sublayer 4c is antiparallel to that of the free magnetic layer 6, thus a tunneling current does not easily flow through the insulating barrier layer 5 disposed between the second pinned magnetic sublayer 4c and the free magnetic layer 6 to maximize a resistance. On the other hand, when the magnetization direction of the second pinned magnetic sublayer 4c is parallel to that of the free magnetic layer 6, the tunneling current flows most easily to minimize the resistance.

On the basis of this principle, a change in electric resistance due to a change in the magnetization of the free magnetic layer 6 affected by the external magnetic field is converted into a change in voltage to detect a leakage magnetic field from a magnetic recording medium.

Figure 2:
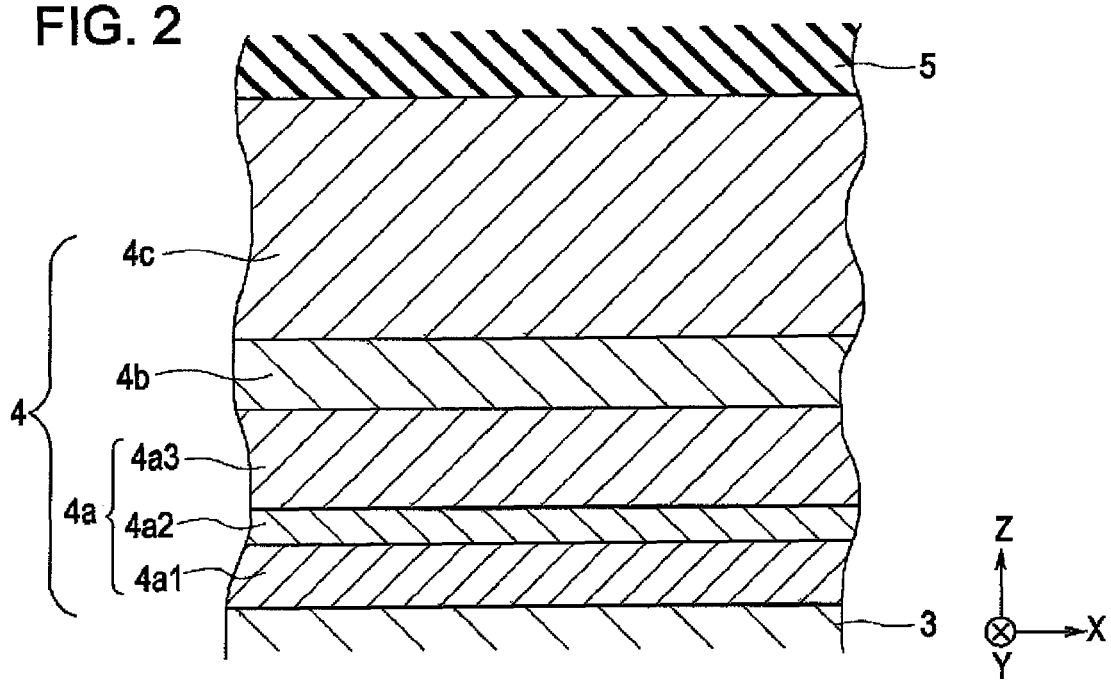
FIG. 2 is a fragmentary enlarged cross-sectional view of the structure of a pinned magnetic layer shown in FIG. 1 according to a first embodiment.
Figure 3:
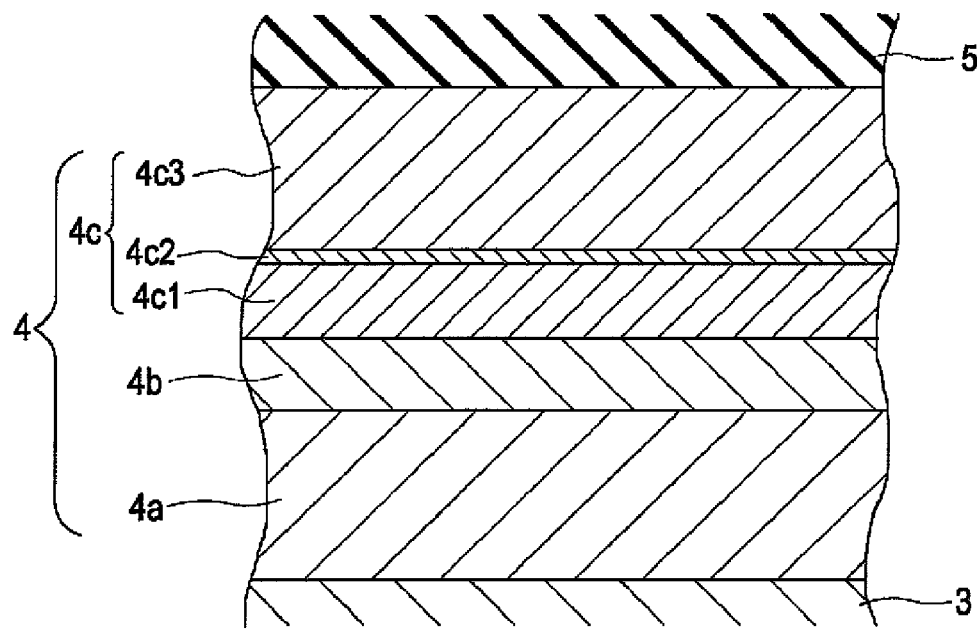
FIG. 3 is a fragmentary enlarged cross-sectional view of the structure of a pinned magnetic layer shown in FIG. 1 according to a second embodiment.
Figure 4:
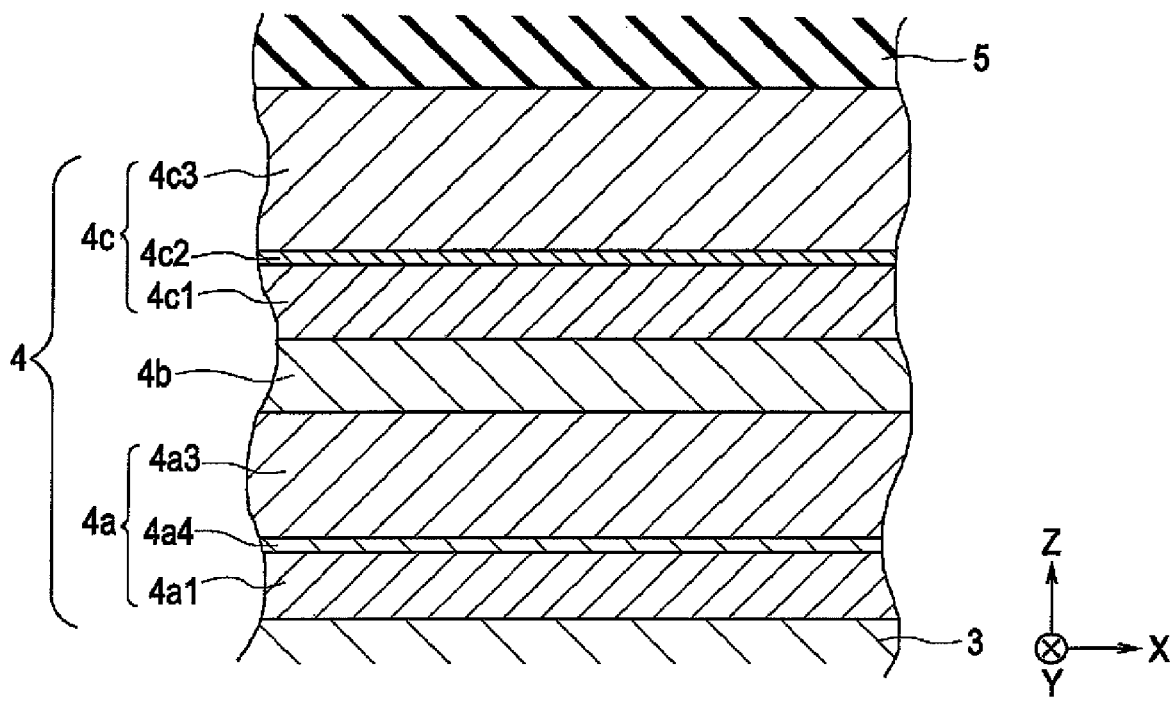
FIG. 4 is a fragmentary enlarged cross-sectional view of the structure of a pinned magnetic layer shown in FIG. 1 according to a third embodiment.

Features of the tunneling magnetic sensing element according to this embodiment will be described below. FIGS. 2 to 4 are each a fragmentary enlarged cross-sectional view of the pinned magnetic layer 4 of the tunneling magnetic sensing element shown in FIG. 1.

As show in FIG. 2, the first pinned magnetic sublayer 4a has a multilayered structure including a lower ferromagnetic subsublayer 4a1, a first insertion subsublayer 4a2, and an upper ferromagnetic subsublayer 4a3, disposed in that order. The first insertion subsublayer 4a2 is composed of a nonmagnetic metal material. The first insertion subsublayer 4a2 has an average thickness exceeding 3 Å and 6 Å or less. In the embodiment shown in FIG. 2, the second pinned magnetic sublayer 4c has a single-layer structure. The first insertion subsublayer 4a2 is preferably composed of at least one element selected from Ti, V, Zr, Nb, Mo, Hf, Ta, and W. Preferably, the first insertion subsublayer 4a2 is composed of Ta.

In the embodiment shown in FIG. 2, the first pinned magnetic sublayer 4a has a structure including the first insertion subsublayer 4a2 which is composed of Ta and which is disposed between the two ferromagnetic subsublayers 4a1 and 4a3. This improves the crystal orientation of magnetic layers of the upper ferromagnetic subsublayer 4a3, the second pinned magnetic sublayer 4c, and the free magnetic layer 6 on the first insertion subsublayer 4a2. Furthermore, the flatness of upper surfaces of the first pinned magnetic sublayer 4a and the second pinned magnetic sublayer 4c is improved, thereby improving the flatness of the interface between the second pinned magnetic sublayer 4c and the insulating barrier layer 5, and improving the flatness of the interface between the insulating barrier layer 5 and the free magnetic layer 6.

Therefore, in this embodiment, the interlayer coupling magnetic field Hin between the pinned magnetic layer 4 and the free magnetic layer 6 is effectively reduced, compared with the known structure not including the first insertion subsublayer 4a2.

Furthermore, the tunneling magnetic sensing element shown in FIG. 2 includes the first insertion subsublayer 4a2 having an average thickness exceeding 3 Å and 6 Å or less and thus has RA (element resistance R×element area A) and the rate of resistance change (ΔR/R) substantially identical to those of the known structure that does not have the first insertion subsublayer 4a2.

In this embodiment, the design value of the element does not need to be changed in order to improve RA and the like. Furthermore, the disposition of the first insertion subsublayer 4a2 inhibits the diffusion of the Mn contained in the antiferromagnetic layer 3 toward the insulating barrier layer 5 in addition to the improvement of the flatness and the crystal orientation of the magnetic layers described above. Therefore, the tunneling magnetic sensing element according to this embodiment has an improved signal-to-noise ratio and low variations in the asymmetry of a waveform, and thus can appropriately respond to an increase in recording density.

As described above, the first insertion subsublayer 4a2 composed of Ta has an average thickness exceeding 3 Å and 6 Å or less. When the first insertion subsublayer 4a has an average thickness of 3 Å or less, the first insertion subsublayer 4a2 does not have the effect of reducing the interlayer coupling magnetic field Hin. On the other hand, when the first insertion subsublayer 4a2 has an average thickness exceeding 6 Å, the magnetic coupling between the lower ferromagnetic subsublayer 4a1 and the upper ferromagnetic subsublayer 4a3 breaks easily to markedly reduce the rate of resistance change (ΔR/R). Furthermore, RA tends to increase. Accordingly, the average thickness of the first insertion subsublayer 4a2 is specified to be more than 3 Å and 6 Å or less.

The first insertion subsublayer 4a2 preferably has an average thickness of 4 Å to 5 Å, thus resulting in small variations in RA and effectively reducing the interlayer coupling magnetic field Hin.

As described above, the first insertion subsublayer 4a2 has a markedly small average thickness. The first insertion subsublayer 4a2 does not need to have a constant thickness as shown in FIG. 2 but may be discontinuously formed on the lower ferromagnetic subsublayer 4a1. The discontinuous formation of the first insertion subsublayer 4a2 increases the magnetic coupling force between the lower ferromagnetic subsublayer 4a1 and the upper ferromagnetic subsublayer 4a3 to increase the effect of pinning the magnetization of the pinned magnetic layer 4. The term "average thickness" of the first insertion subsublayer 4a2 means a thickness when the first insertion subsublayer 4a2 is leveled on the entire surface of the lower ferromagnetic subsublayer 4a1 so as to have a constant thickness. Thus, in the case where the first insertion subsublayer 4a2 is discontinuously disposed on the lower ferromagnetic subsublayer 4a1, the term "average thickness" is also applied to a portion (pinhole portion) where the first insertion subsublayer 4a2 is not formed on the lower ferromagnetic subsublayer 4a1.

Preferably, the first insertion subsublayer 4a2 is disposed in the first pinned magnetic sublayer 4a and adjacent to the antiferromagnetic layer 3. Thus, the upper ferromagnetic subsublayer 4a3 has a thickness greater than that of the lower ferromagnetic subsublayer 4a1. Hence, the first insertion subsublayer 4a2 is remote from the insulating barrier layer 5, thus reducing the effect of Ta on the insulating barrier layer 5. For example, the amount of Ta diffusion in the insulating barrier layer 5 is low, thus maintaining a high rate of resistance change ($\Delta R/R$). Preferably, the lower ferromagnetic subsublayer 4a1 and the upper ferromagnetic subsublayer 4a3 each have a thickness of 10 Å or more. For example, the lower ferromagnetic subsublayer 4a1 has an average thickness of 12 Å, the first insertion subsublayer 4a2 has an average thickness of 4 Å, and the upper ferromagnetic subsublayer 4a3 has an average thickness of 14 Å.

The lower ferromagnetic subsublayer 4a1 and the upper ferromagnetic subsublayer 4a3 may be composed of the same ferromagnetic material but may be composed of different ferromagnetic materials. For example, the lower ferromagnetic subsublayer 4a1 and the upper ferromagnetic subsublayer 4a3 are preferably composed of Co—Fe. That is, the first pinned magnetic sublayer 4a preferably has a multilayered structure of Co—Fe/Ta/Co—Fe. In this case, preferably, the second pinned magnetic sublayer 4c is also composed of a Co—Fe alloy. This results in a greater degree of RKKY interaction between the second pinned magnetic sublayer 4c and the first pinned magnetic sublayer 4a.

Furthermore, this also increases the exchange coupling magnetic filed (Hex) between the first pinned magnetic sublayer 4a and the antiferromagnetic layer 3, thereby increasing the effect of pinning the magnetization of the pinned magnetic layer 4.

In this embodiment the disposition of the first insertion subsublayer 4a2 in the first pinned magnetic sublayer 4a effectively allows the upper ferromagnetic subsublayer 4a3 and the second pinned magnetic sublayer 4c disposed on the first insertion subsublayer 4a2 to have a face-centered cubic (fcc) structure, in which equivalent crystal planes each typically expressed as the {111} plane are dominantly oriented in the direction parallel to surfaces of the layers (X-Y plane).

In this embodiment, the insulating banier layer 5 may be composed of Ti—O (titanium oxide) or Al—O (aluminum oxide) other than Ti—Mg—O.

In FIG. 3, the second pinned magnetic sublayer 4c has a multilayered structure including a lower ferromagnetic subsublayer 4c1, a second insertion subsublayer 4c2, and an upper ferromagnetic subsublayer 4c3, disposed in that order from the bottom. In the embodiment shown in FIG. 3, the first pinned magnetic sublayer 4a has a single-layer structure.

The second insertion subsublayer 4c2 is composed of Ta. The second insertion subsublayer 4c2 has an average thickness of 1 Å to 3 Å.

In this embodiment, the second pinned magnetic sublayer 4c has a structure including the second insertion subsublayer 4c2, which is composed of Ta and which is disposed between the two ferromagnetic subsublayers 4c1 and 4c3. This improves the crystal orientation of magnetic layers of the upper ferromagnetic subsublayer 4c3 and the free magnetic layer 6 on the second insertion subsublayer 4c2. Furthermore, the flatness of the upper surface of the second pinned magnetic sublayer 4c is improved, thereby improving the flatness of the interface between the second pinned magnetic sublayer 4c and the insulating barrier layer 5, and further improving the flatness of the interface between the insulating barrier layer 5 and the free magnetic layer 6.

Therefore, in this embodiment, the interlayer coupling magnetic field Hin between the pinned magnetic layer 4 and the free magnetic layer 6 is effectively reduced, compared with known structures not including the first insertion subsublayer 4a2.

Furthermore, the tunneling magnetic sensing element shown in FIG. 2 has RA (element resistance R×element area A) and the rate of resistance change ($\Delta R/R$) substantially identical to those of known structures that do not have the second insertion subsublayer 4c2.

In this embodiment, the design value of the element does not need to be changed in order to improve RA and the like. Furthermore, the disposition of the second insertion subsublayer 4c2 inhibits the diffusion of the Mn contained in the antiferromagnetic layer 3 toward the insulating barrier layer 5 in addition to the improvement of the flatness and the crystal orientation of the magnetic layers described above. Therefore, the tunneling magnetic sensing element according to this embodiment has an improved signal-to-noise ratio and low variations in the asymmetry of a waveform and thus can appropriately respond to an increase in recording density.

As described above, the second insertion subsublayer 4c2 composed of Ta has an average thickness of 1 Å to 3Å. When the second insertion subsublayer 4c2 has an average thickness of less than 1 Å, the second insertion subsublayer 4c2 does not have the effect of reducing the interlayer coupling magnetic field Hin. On the other hand, when the second insertion subsublayer 4c2 has an average thickness exceeding 3 Å, RA is markedly reduced. Accordingly, the average thickness of the second insertion subsublayer 4c2 is specified to he 1 Å to 3 Å.

The second insertion subsublayer 4c2 preferably has an average thickness of 2 Å to 3 Å, thus resulting in small variations in RA and effectively reducing the interlayer coupling magnetic field Hin.

The average thickness of the second insertion subsublayer 4c2 disposed in the second pinned magnetic sublayer 4c shown in FIG. 3 is smaller than that of the first insertion subsublayer 4a2 disposed in the first pinned magnetic sublayer 4a shown in FIG. 2.

The position of the second insertion subsublayer 4c2 is closer to the insulating barrier layer 5 than the position of the first insertion subsublayer 4a2. Hence, the disposition of the second insertion subsublayer 4c2 having a smaller thickness, for example, the amount of diffusion of Ta constituting the second insertion subsublayer 4c2 into the insulating barrier layer 5 is reduced to maintain a high rate of resistance change (ΔR/R).

The upper ferromagnetic subsublayer 4c3 preferably has a thickness larger than that of the lower ferromagnetic subsublayer 4c1 in such a manner that the second insertion subsublayer 4c2 is remote from the insulating barrier layer 5. Preferably, the upper ferromagnetic subsublayer 4c3 and the lower ferromagnetic subsublayer 4c1 each have a thickness of 10 Å or more. For example, the lower ferromagnetic subsublayer 4c1 has a thickness of 12 Å, the second insertion subsublayer 4c2 has a thickness of 2 Å, and the upper ferromagnetic subsublayer 4c3 has a thickness of 20 Å.

The lower ferromagnetic subsublayer 4c1 and the upper ferromagnetic subsublayer 4c3 are preferably composed of Co—Fe. That is, the second pinned magnetic sublayer 4c preferably has a multilayered structure of Co—Fe/Ta/Co—Fe. In this case, preferably, the first pinned magnetic sublayer 4a is also composed of a Co—Fe alloy. This results in a greater degree of RKKY interaction between the second pinned magnetic sublayer 4c and the first pinned magnetic sublayer 4a, thereby increasing the effect of pinning the magnetization of the pinned magnetic layer 4.

In the embodiment shown in FIG. 4, a third insertion subsublayer 4a4 composed of a nonmagnetic material is disposed in the first pinned magnetic sublayer 4a. The second insertion subsublayer 4c2 composed of Ta is disposed in the second pinned magnetic sublayer 4c. The third insertion subsublayer 4a4 is preferably composed of at least one element selected from Ti, V, a Zr, Nb, Mo, Hf, Ta, and W. Prefereably, the third insertion subsublayer 4a4 is composed of Ta. The third insertion subsublayer 4a4 and the second insertion subsublayer 4c2 preferably have an average thickness of 1 Å to 3Å. Furthermore, the third insertion subsublayer 4a4 and the second insertion subsublayer 4c2 preferably have the same average thickness. The third insertion subsublayer 4a4 has an average thickness smaller than that of the first insertion subsublayer 4a2 described in FIG. 2.

Thereby, the tunneling magnetic sensing element shown in FIG. 4 has RA and the rate of resistance change (ΔR/R) substantially identical to those of the known structure not having the third insertion subsublayer 4a4 and the second insertion subsublayer 4c2.

Furthermore, the tunneling magnetic sensing element has an interlayer coupling magnetic field Hin smaller than that of the known structure.

Comparison of the embodiment shown in FIG. 4 with the embodiment in which the second insertion subsublayer 4c2 is disposed in only the second pinned magnetic sublayer 4c shown in FIG. 3, shows that the dependence of the interlayer coupling magnetic field Hin on the Ta thickness and the dependence of RA on the Ta thickness in the embodiment shown in FIG. 4 are substantially identical to those in the embodiment shown in FIG. 3. A change in RA as the average thickness of the insertion subsublayers 4a4 and 4c2 is changed in the range of 1 to 3 Å in the embodiment shown in FIG. 4 is effectively smaller than that in the embodiment shown in FIG. 3.

In the embodiment shown in FIG. 4, preferred materials of the lower ferromagnetic subsublayers 4a1 and 4c1 and the upper ferromagnetic subsublayers 4a3 and 4c3 are identical to those in the embodiments shown in FIGS. 2 and 3. Furthermore, the position of the second insertion subsublayer 4c2 in the second pinned magnetic sublayer 4c is the same as in the embodiment shown in FIG. 3. The third insertion subsublayer 4a4 in the first pinned magnetic sublayer 4a is preferably adjacent to the antiferromagnetic layer 3 in the same way as in the first insertion subsublayer 4a2 described in FIG. 2.

In the embodiment shown in FIG. 1, the antiferromagnetic layer 3, the pinned magnetic layer 4, the insulating barrier layer 5, and the free magnetic layer 6 are stacked in that order from the bottom. Alternatively, the free magnetic layer 6, the insulating barrier layer 5, the pinned magnetic layer 4, and the antiferromagnetic layer 3 may be stacked in that order from the bottom. In this case, the free magnetic layer 6 has a multilayered ferrimagnetic structure similar to the pinned magnetic layer 4 shown in FIG. 1. The free magnetic layer 6 includes a first free magnetic sublayer, a nonmagnetic intermediate sublayer, and a second free magnetic sublayer, stacked in that order from the bottom. The first free magnetic sublayer and/or the second free magnetic sublayer has a multilayered structure in which any one of the insertion subsublayers shown in FIGS. 2 to 4 is disposed between two ferromagnetic subsublayers. Each of the ferromagnetic subsublayers constituting the free magnetic layer is preferably composed of Ni—Fe. Furthermore, an enhancing sublayer composed of Co—Fe may be disposed between the second free magnetic sublayer and the insulating barrier layer.

Alternatively, a dual tunneling magnetic sensing element including a lower antiferromagnetic layer, a lower pinned magnetic layer, a lower insulating barrier layer, a free magnetic layer, an upper insulating barrier layer, an upper pinned magnetic layer, and an upper antiferromagnetic layer, stacked in that order from the bottom may be used.

In the dual tunneling magnetic sensing element, at least the lower pinned magnetic layer has a multilayered ferrimagnetic structure according to the embodiment. The insertion subsublayers shown in FIGS. 2 to 4 are disposed in the first pinned magnetic sublayer and/or the second pinned magnetic sublayer.

Each of the single first insertion subsublayer 4a2, the single second insertion subsublayer 4c2, and the single third insertion subsublayer 4a4 may be disposed in a corresponding one of the magnetic sublayers. Alternatively, at least two first insertion subsublayers 4a2, at least two second insertion subsublayers 4c2, and at least two third insertion subsublayers 4a4 may be disposed in the respective magnetic sublayers.

The interlayer coupling magnetic field Hin is sufficiently reduced by disposition of only the single insertion subsublayer 4a2, the single insertion subsublayer 4c2, and the single insertion subsublayer 4a4. When the plurality of insertion subsublayers 4a2, the plurality of insertion subsublayers 4c2, and the plurality of insertion subsublayers 4a4 are disposed, RA and the rate of resistance change (ΔR/R) change easily. Thus, the single insertion subsublayer 4a2, the single insertion subsublayer 4c2, and the single insertion subsublayer 4a4 are preferably disposed.

Figure 5:
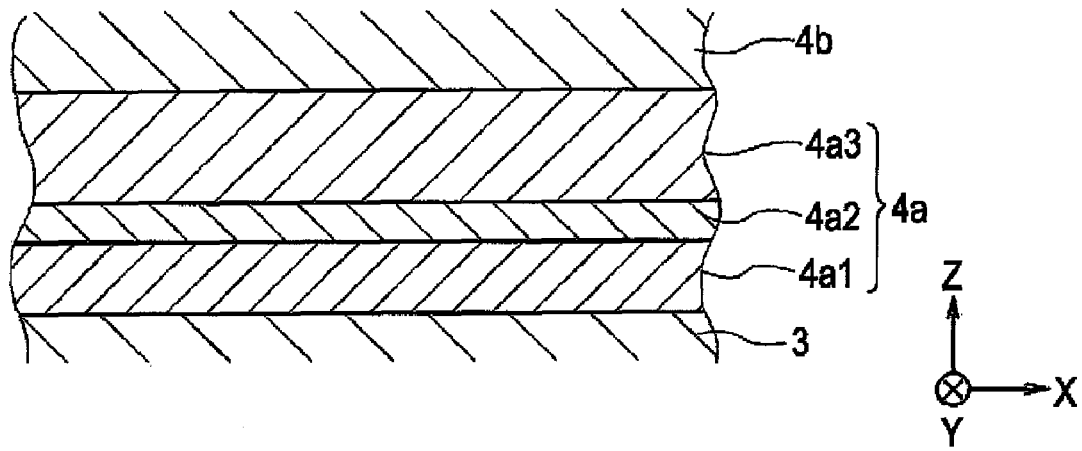
FIG. 5 is a fragmentary enlarged cross-sectional view mainly showing the multilayered structure of a first pinned magnetic sublayer in the pinned magnetic layer of a tunneling magnetic sensing element during a production process shown in FIG. 6.

A method for producing the tunneling magnetic sensing element according to the embodiment will be described below. FIGS. 6 to 9 are each a fragmentary cross-sectional view of the tunneling magnetic sensing element during the production process, each cross-sectional view being the same position as the tunneling magnetic sensing element shown in FIG. 1. FIG. 5 is a fragmentary enlarged cross-sectional view mainly showing the multilayered structure of a first pinned magnetic sublayer in the pinned magnetic layer of the tunneling magnetic sensing element during the production process shown in FIG. 6.

Figure 6:
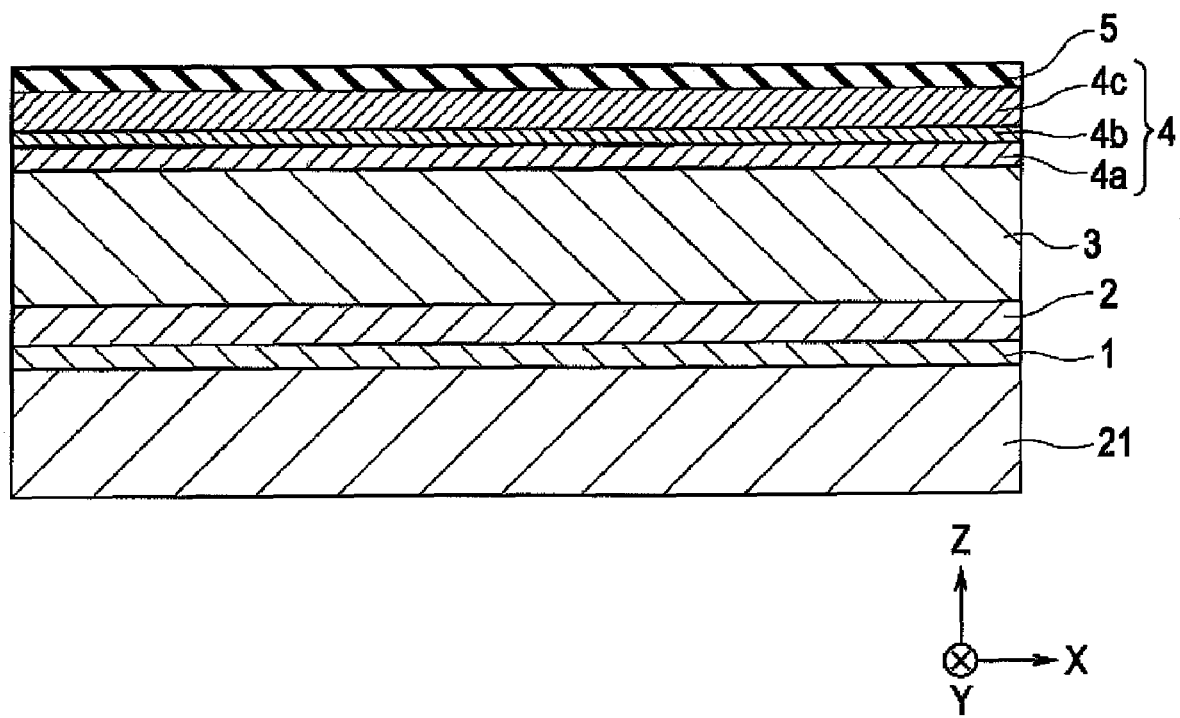
FIG. 6 is a fragmentary cross-sectional view of the tunneling magnetic sensing element during the production process.

In the step shown in FIG. 6, the underlying layer 1, the seed layer 2, the antiferromagnetic layer 3, the first pinned magnetic sublayer 4a, the nonmagnetic intermediate sublayer 4b, and the second pinned magnetic sublayer 4c are successively formed in that order on the bottom shield layer 21.

In this embodiment, as shown in FIG. 5, when the first pinned magnetic sublayer 4a is formed, the lower ferromagnetic subsublayer 4a1 having a thickness of about ten angstroms and composed of, for example, Co—Fe, is formed by sputtering. The first insertion subsublayer 4a2 composed of, for example, Ta and having a thickness exceeding 3 Å and 6 Å or less is formed by sputtering on the lower ferromagnetic subsublayer 4a1.

Subsequently, the upper ferromagnetic subsublayer 4a3 composed of, for example, a Co—Fe alloy and having a thickness of about ten-odd angstroms is formed by sputtering on the first insertion subsublayer 4a2. The upper ferromagnetic subsublayer 4a3 preferably has a thickness larger than that of the lower ferromagnetic subsublayer 4a1.

As shown in FIG. 6, the insulating barrier layer 5 composed of, for example, Ti—Mg—O on the second pinned magnetic sublayer 4c. The insulating barrier layer 5 composed of Ti—Mg—O is formed by, for example, sputtering a Ti layer on the second pinned magnetic sublayer 4c, sputtering a Mg layer on the Ti layer, and then subjecting the Ti layer and the Mg layer to oxidation.

Figure 7:
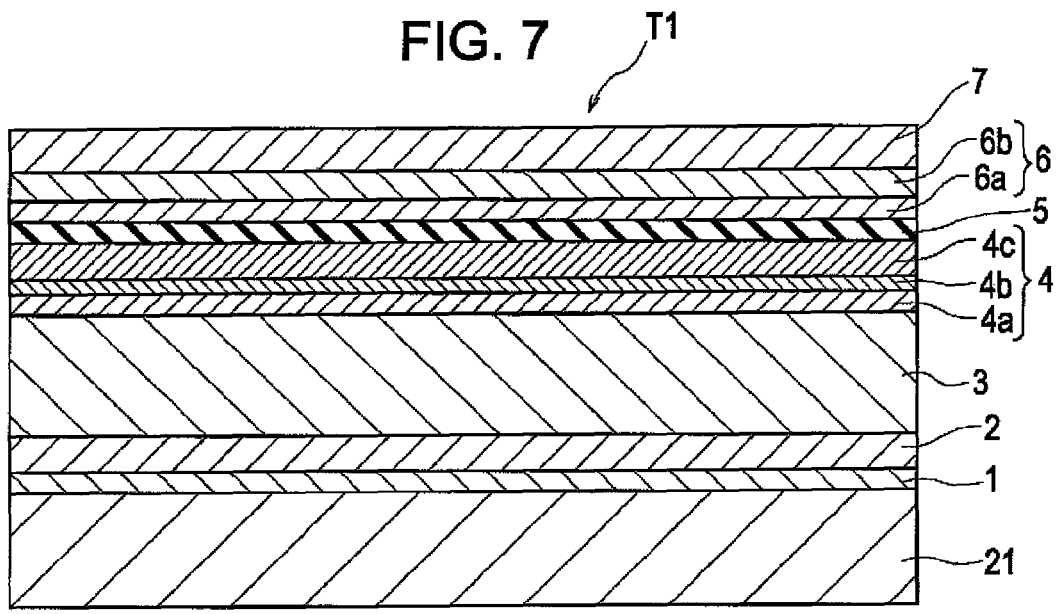
FIG. 7 is a process drawing (fragmentary cross-sectional view) showing a step subsequent to the step shown in FIG. 6.
Figure 8:
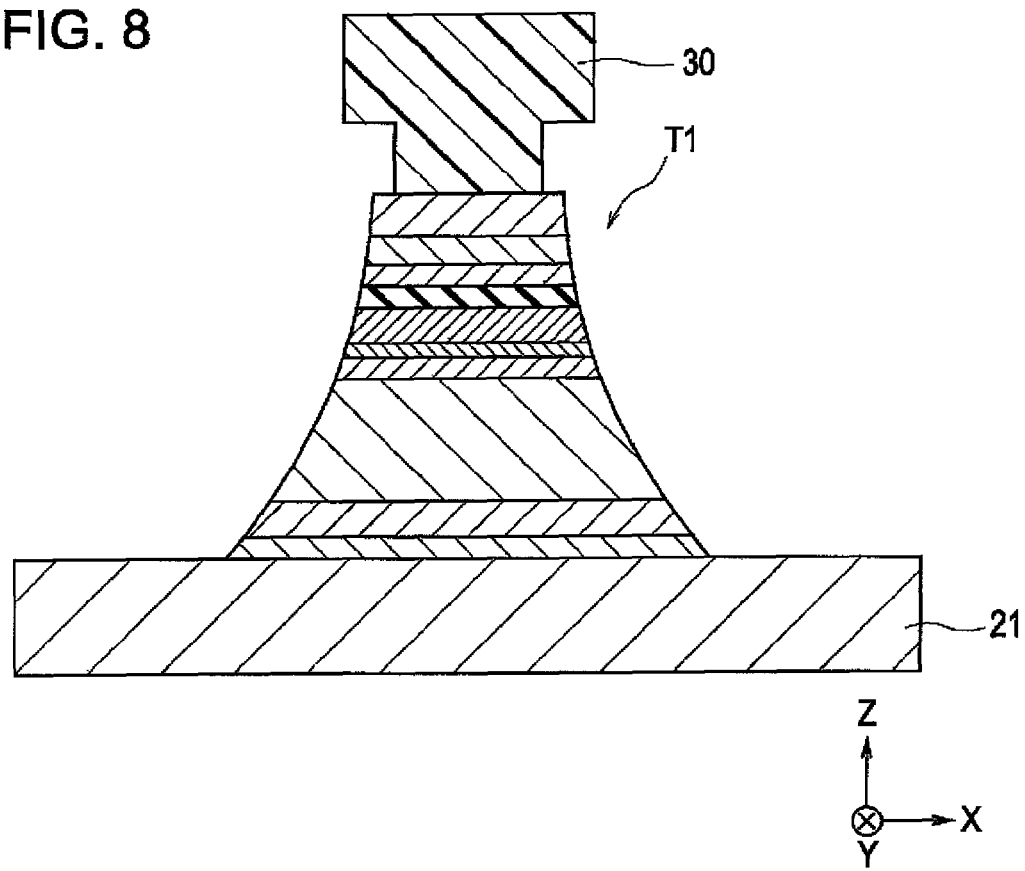
FIG. 8 is a process drawing (fragmentary cross-sectional view) showing a step subsequent to the step shown in FIG. 7.

As shown in FIG. 7, the free magnetic layer 6 including the enhancing sublayer 6a and the soft magnetic sublayer 6b and the protective layer 7 are formed on the insulating barrier layer 5. Thereby, the laminate TI including the underlying layer I to the protective layer 7 is formed.

A lift-off resist layer 30 is formed on the laminate TI. Both sides, which are not covered with the lift-off resist layer 30, of the laminate TI in the track width direction (X direction in the figure) are removed by, for example, etching (see FIG. 8).

Figure 9:
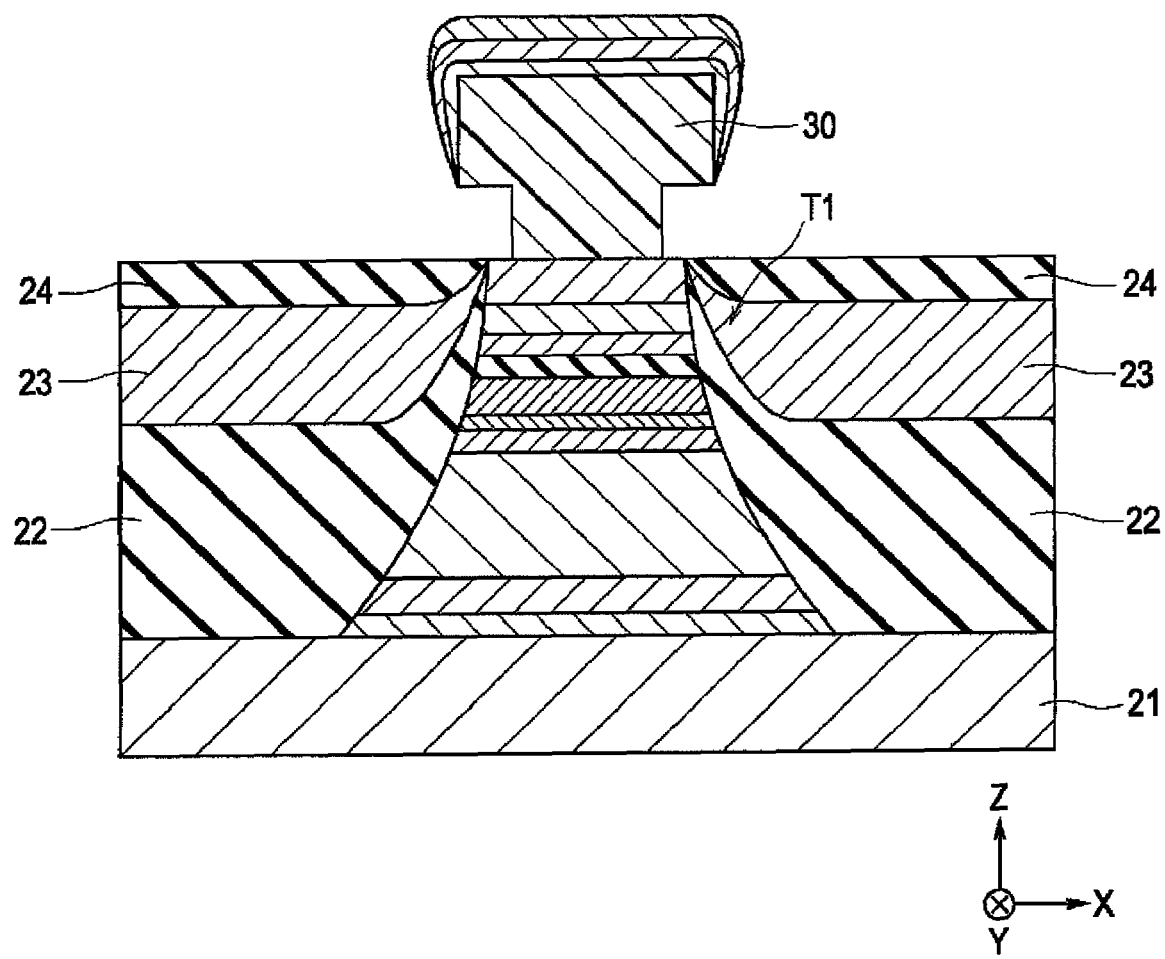
FIG. 9 is a process drawing (fragmentary cross-sectional view) showing a step subsequent to the step shown in FIG. 8.

The lower insulating layers 22, the hard bias layers 23, and the upper insulating layers 24 are stacked, in that order from the bottom, on the bottom shield layer 21 and on both sides of the laminate T1 in the track width direction (X direction in the figure, see FIG. 9).

The lift-off resist layer 30 is removed. The top shield layer 26 is formed on the laminate T1 and the upper insulating layers 24.

The method for producing the tunneling magnetic sensing element includes annealing after the formation of the laminate Ti. Typical annealing aims to generate the exchange coupling magnetic filed (Hex) between the antiferromagnetic layer 3 and the first pinned magnetic sublayer 4a.

In this embodiment, as described in FIG. 3, the second pinned magnetic sublayer 4c may have the multilayered structure including the lower ferromagnetic subsublayer 4c1, the second insertion subsublayer 4e2 composed of Ta, and the upper ferromagnetic subsublayer 4c3. Alternatively, as described in FIG. 4, the first pinned magnetic sublayer 4a may have the multilayered structure including the lower ferromagnetic subsublayer 4a1, the third insertion subsublayer 4a4, and the upper ferromagnetic subsublayer 4c3, and the second pinned magnetic sublayer 4c may have the multilayered structure including the lower ferromagnetic subsublayer 4c1, second insertion subsublayer 4c2 composed of Ta, and the upper ferromagnetic subsublayer 4c3.

The tunneling magnetic sensing element according to this embodiment may be used as a magnetic random access memory (MRAM) or a magnetic sensor as well as the application as a magnetic head incorporated in a hard disk drive.

EXAMPLE 1

A tunneling magnetic sensing element including a first insertion subsublayer in a first pinned magnetic sublayer was formed, as shown in FIG. 2.

A laminate T1 having the following structure was formed: underlying layer 1: Ta (30)/seed layer 2: $Ni_{49at\%}/Fe_{12at\%}Cr_{39at\%}$(50)/antiferromagnetic layer 3: Ir26at % Mn74at % (70)/pinned magnetic layer 4 [first pinned magnetic sublayer 4a/nonmagnetic intermediate sublayer 4b; Ru (8.5)/second pinned magnetic sublayer 4c; $Co_{90at\%}Fe_{10at\%}$ (28)]/insulating barrier layer 5/free magnetic layer 6 [$Fe_{90at\%}Co_{10at\%}$(10)/$Ni_{88at\%}Fe_{12at\%}$(50)]/Ru (10)/protective layer 7: Ta (180), stacked in that order from the bottom.

In this example, the first pinned magnetic sublayer 4a having the following structure was formed as shown in FIG. 2: lower ferromagnetic subsublayer 4a1:
$Co_{70at\%}Fe_{30at\%}$ (12)/first insertion subsublayer 4a2: Ta (X)/upper ferromagnetic subsublayer 4a3: $Co_{70at\%}Fe_{30at\%}/$ (14), stacked in that order from the bottom.

Furthermore, in this example, after a two-layer structure of Ti (4.6)/Mg (0.6), stacked in that order from the bottom, was formed, Ti and Mg were oxidized to form the insulating barrier layer 5 composed of Ti—Mg—O.

The value in parentheses indicates an average thickness (unit: 521 ).

After the formation of the laminate T1, annealing was performed for 3 hours 40 minutes at 270° C.

Furthermore, the laminate TI not including the first insertion subsublayer 4a2 was produced as a known example, the laminate Ti serving as a standard for comparison. The interlayer coupling magnetic field Hin and RA in the known example were plotted on graphs in FIGS. 12 and 13 described below.

In this example, the relationship between the average thickness (X) and the interlayer coupling magnetic field Hin of the first insertion subsublayer 4a2 and the relationship between the average thickness (X) and the RA of the first insertion subsublayer 4a2 were studied.

Figure 10:
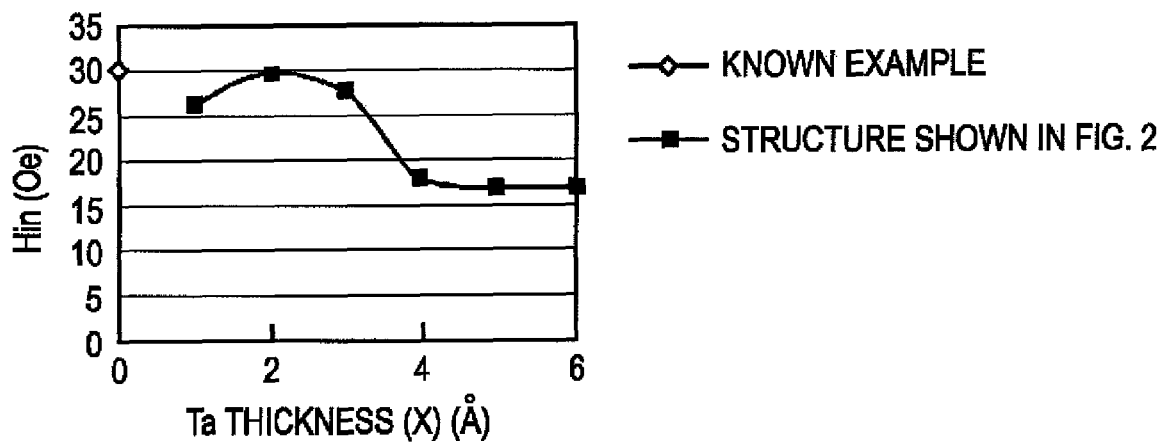
FIG. 10 is a graph showing the relationship between the average thickness (X) of a first insertion subsublayer and the interlayer coupling magnetic field Hin of a tunneling magnetic sensing element including the first pinned magnetic sublayer having the first insertion subsublayer shown in FIG. 2.
Figure 11:
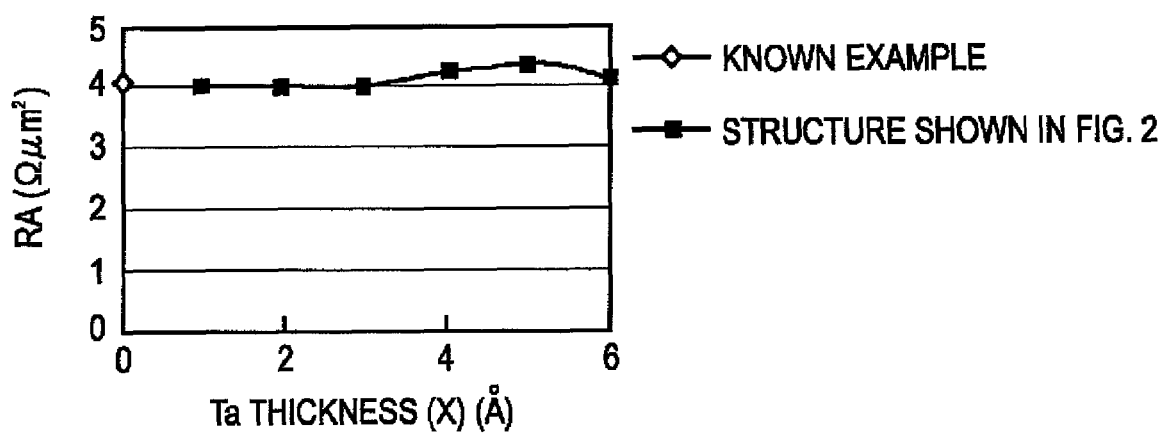
FIG. 11 is a graph showing the relationship between the average thickness (X) of a first insertion subsublayer and RA of a tunneling magnetic sensing element including the first pinned magnetic sublayer having the first insertion subsublayer shown in FIG. 2.

FIG. 10 is a graph showing the relationship between the average thickness and the interlayer coupling magnetic field Hin of the first insertion subsublayer 4a2. FIG. 11 is a graph showing the relationship between the average thickness and the RA of the first insertion subsublayer 4a2.

As shown in FIG. 10, when the average thickness of the first insertion subsublayer 4a2 was in the range of 1 Å to 3 Å, the interlayer coupling magnetic field Hin was substantially the same as the known example or was slightly lower than that of the known example. When the average thickness of the first insertion subsublayer 4a2 exceeded 3 Å, the interlayer coupling magnetic field Hin was markedly reduced compared with the known example. In particular, when the average thickness of the first insertion subsublayer 4a2 was 4 Å or more, the interlayer coupling magnetic field Hin decreased by almost half compared with that of the known example.

As shown in FIG. 11, when the average thickness of the first insertion subsublayer 4a2 was in the range of 1 Å to 6 Å, RA was substantially the same as the known example.

The results shown in FIGS. 10 and 11 demonstrated that in the case where the first insertion subsublayer 4a2 composed of Ta was disposed in the first pinned magnetic sublayer 4a, the first insertion subsublayer 4a2 having an average thickness exceeding 3 Å and 6 Å or less resulted in substantially the same RA as that in the known example not including the first insertion subsublayer 4a2 and resulted in an interlayer coupling magnetic field Hin lower than that in the known example. In particular, it was found that the first insertion subsublayer 4a2 having an average thickness of 4 Å to 5 521 resulted in a sufficiently low interlayer coupling magnetic field Hin compared with the known example.

In the tunneling magnetic sensing element in Example 1 including the first insertion subsublayer 4a2 disposed in the first pinned magnetic sublayer 4a, the first insertion subsublayer 4a2 being composed of Ta and having an average thickness exceeding 3 Å and 6 Å or less, the rate of resistance change (ΔR/R) was about 26% to about 29%. In the known example, the rate of resistance change (ΔR/R) was about 28%. It was found that in Example 1, RA and the rate of resistance change (ΔR/R) were substantially identical to those in the known example.

EXAMPLE 2

A tunneling magnetic sensing element including a second insertion subsublayer disposed in a second pinned magnetic sublayer was formed, as shown in FIG. 3.

A laminate T1 having the following structure was formed: underlying layer 1: Ta (30)/seed layer 2: $Ni_{49at\%}Fe_{12at\%}Cr_{39at\%}$(50)/antiferromagnetic layer 3: $Ir_{26at\%}Mn_{74at\%}$(70)/pinned magnetic layer 4 [first pinned magnetic sublayer 4a: $Co_{70at\%}Fe_{30at\%}$(24)/nonmagnetic intermediate sublayer 4b: Ru (8.5)/second pinned magnetic sublayer 4c]/insulating barrier layer 5/free magnetic layer 6 [$Fe_{90at\%}Co_{10at\%}$(10)/$Ni_{86at\%}Fe_{14at\%}$(50)]/Ru (10)/protective layer 7: Ta (180), stacked in that order from the bottom.

In this example, the second pinned magnetic sublayer 4c having the following structure was formed as shown in FIG. 3: lower ferromagnetic subsublayer 4c1: $Co_{90at\%}Fe_{10at\%}$(12)/second insertion subsublayer 4c2: Ta (Y)/upper ferromagnetic subsublayer 4c3: $Co_{90at\%}Fe_{10at\%}$(20), stacked in that order from the bottom.

Furthermore, in this example, after a two-layer structure of Ti (4.6)/Mg (0.6), stacked in that order from the bottom, was formed, Ti and Mg were oxidized to form the insulating barrier layer 5 composed of Ti—Mg—O.

The value in parentheses indicates an average thickness (unit: Å).

After the formation of the laminate T1, annealing was performed for 3 hours 40 minutes at 270° C.

EXAMPLE 3

A tunneling magnetic sensing element including a third insertion subsublayer disposed in a first pinned magnetic sublayer and including a second insertion subsublayer disposed in a second pinned magnetic sublayer was formed, as shown in FIG. 4.

A laminate T1 having the following structure was formed: underlying layer 1: Ta (30)/seed layer 2: $Ni_{49at\%}Fe_{12at\%}Cr_{39at\%}$(50)/antiferromagnetic layer 3: $Ir_{26at\%}Mn_{74at\%}$(70)/pinned magnetic layer 4 [first pinned magnetic sublayer 4a/nonmagnetic intermediate sublayer 4b: Ru (8.5)/second pinned magnetic sublayer 4c]/insulating barrier layer 5/free magnetic layer 6 [$Fe_{90at\%}Co_{10at\%}$(10)/$Ni_{86at\%}Fe_{14at\%}$(50)]/Ru (10)/protective layer 7: Ta (180), stacked in that order from the bottom.

In this example, the first pinned magnetic sublayer 4a having the following structure was formed as shown in FIG. 4: lower ferromagnetic subsublayer 4a1: $Co_{70at\%}Fe_{30at\%}$(12)/third insertion subsublayer 4a4: Ta (Y)/upper ferromagnetic subsublayer 4a3: $Co_{70at\%}Fe_{30at\%}$(14), stacked in that order from the bottom. The second pinned magnetic sublayer 4c having the following structure was formed as shown in FIG. 4: lower ferromagnetic subsublayer 4c1: $Co_{90at\%}Fe_{10at\%}$(12)/second insertion subsublayer 4c2: Ta (Y)/upper ferromagnetic subsublayer 4c3: $Co_{90at\%}Fe_{10at\%}$(20), stacked in that order from the bottom.

Furthermore, in this example, after a two-layer structure of Ti (4.6)/Mg (0.6), stacked in that order from the bottom, was formed, Ti and Mg were oxidized to form the insulating barrier layer 5 composed of Ti—Mg—O.

The value in parentheses indicates an average thickness (unit: Å).

After the formation of the laminate T1, annealing was performed for 3 hours 40 minutes at 270° C. The average thickness (Y) of the second insertion subsublayer 4c2 and the third insertion subsublayer 4a4 was changed while the average thickness (Y) of the second insertion subsublayer 4c2 was the same value as that of the third insertion subsublayer 4a4.

Figure 12:
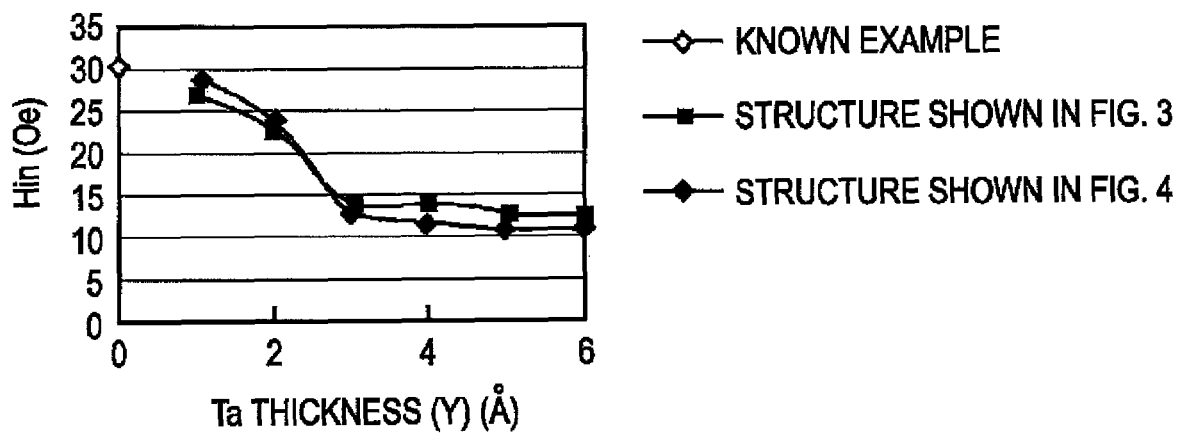
FIG. 12 is a graph showing the relationship between the interlayer coupling magnetic field Hin and the average thickness (Y) of a second insertion subsublayer of a tunneling magnetic sensing element including the second pinned magnetic sublayer having the second insertion subsublayer shown in FIG. 3. Also shown is the relationship between the interlayer coupling magnetic field Hin and the average thickness (Y) of a third insertion subsublayer and a second insertion subsublayer of a tunneling magnetic sensing element, which includes a first pinned magnetic sublayer having the third insertion subsublayer and which includes a second pinned magnetic sublayer having the second insertion subsublayer shown in FIG. 4.

In this example, the relationship between the interlayer coupling magnetic field Hin and the average thickness (Y) of the second insertion subsublayer 4c2 having the structure shown in FIG. 3 and the relationship between the interlayer coupling magnetic field Hin and the average thickness (Y) of the third insertion subsublayer 4a4 and the second insertion subsublayer 4c2 having the structure shown in FIG. 4 were studied. FIG. 12 shows the results.

Figure 13:
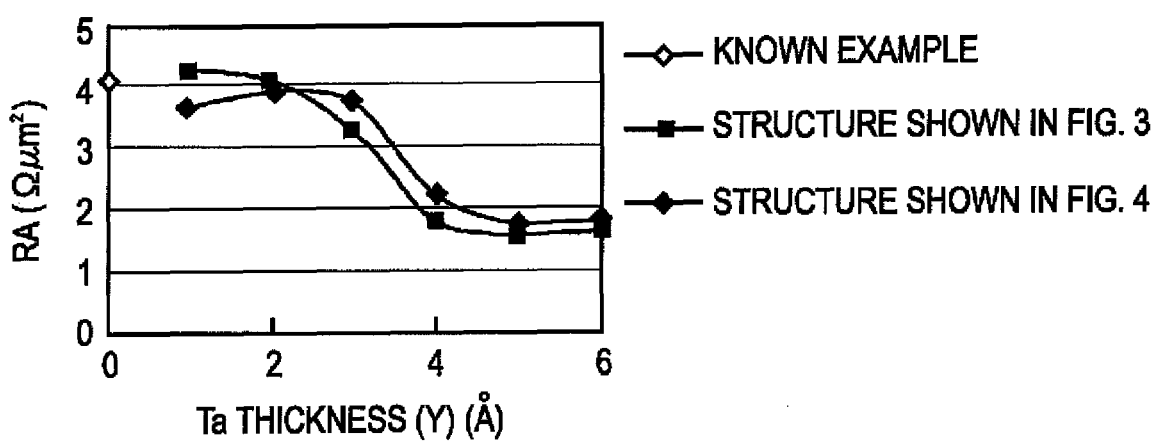
FIG. 13 is a graph showing the relationship between RA and the average thickness (Y) of the second insertion subsublayer of the tunneling magnetic sensing element including the second pinned magnetic sublayer having the second insertion subsublayer shown in FIG. 3. Also shown is the relationship between RA and the average thickness (Y) of the third insertion subsublayer and the second insertion subsublayer of the tunneling magnetic sensing element, which includes the first pinned magnetic sublayer having the third insertion subsublayer and which includes the second pinned magnetic sublayer having the second insertion subsublayer shown in FIG. 4.

Furthermore, the relationship between RA and the average thickness (Y) of the second insertion subsublayer 4c2 having the structure shown in FIG. 3 and the relationship between RA and the average thickness (Y) of the third insertion subsublayer 4a4 and the second insertion subsublayer 4c2 having the structure shown in FIG. 4, were studied. FIG. 13 shows the results.

As shown in FIG. 12, it was found that the second insertion subsublayer 4c2 having the structure shown in FIG. 3 and having an average thickness (Y) of 1 Å or more, reduced the interlayer coupling magnetic field Hin compared with the known example.

Furthermore, as shown in FIG. 12, it was found that when the average thickness (Y) of the second insertion sub sublayer 4c2 and the third insertion subsublayer 4a4 having the structure shown in FIG. 4 was 1 Å or more, the interlayer coupling magnetic field Hin was lower than that in the known example.

On the other hand, as shown in FIG. 13, it was found that when the average thickness (Y) of the second insertion subsublayer 4c2 having the structure shown in FIG. 3 was more than 3 Å, RA was significantly lower than that in the known example.

Furthermore, as shown in FIG. 13, it was found that when the average thickness (Y) of the second insertion subsublayer 4c2 and the third insertion subsublayer 4a4 having the structure shown in FIG. 4 was more than 3 Å, RA was significantly lower than that in the known example.

Thus, it was found that when the average thickness (Y) of the second insertion subsublayer 4c2 having the structure shown in FIG. 3 was set in the range of 1 Å to 3 Å, RA was substantially the same value as the known example, and the interlayer coupling magnetic field Hin was lower than that in the known example.

In the tunneling magnetic sensing element in Example 2 including the second insertion subsublayer 4c2 disposed in the second pinned magnetic sublayer 4c, the second insertion subsublayer 4c2 being composed of Ta and having an average thickness of 1 Å to 3 Å, the rate of resistance change (ΔR/R) was about 26% to about 29%. In the known example, the rate of resistance change (ΔR/R) was about 28%. It was found that in Example 2, RA and the rate of resistance change (ΔR/R) were substantially identical to those in the known example.

As shown in FIGS. 12 and 13, the average thickness (Y) of the second insertion subsublayer 4c2 and the third insertion subsublayer 4a4 having the structure shown in FIG. 4 was set in the range of 1 Å to 3 Å, RA was substantially the same value as the known example, and the interlayer coupling magnetic field Hin was lower than that in the known example.

In particular, as shown in FIG. 13, it was found that the structure shown in FIG. 4 was suitable rather than the structure shown in FIG. 13 because when the Ta thickness was changed in the range of 1 Å to 3 Å, the variations in RA were small with respect to the known example.

In the tunneling magnetic sensing element in Example 3, including the second insertion subsublayer 4c2 disposed in the second pinned magnetic sublayer 4c and including the third insertion subsublayer 4a4 disposed in the first pinned magnetic sublayer 4a, the second insertion subsublayer 4c2 and the third insertion subsublayer 4a4 each being composed of Ta and each having an average thickness of 1 Å to 3 Å, the rate of resistance change (ΔR/R) was about 26% to about 29%. In the known example, the rate of resistance change (ΔR/R) was about 28%. It was found that in Example 3, RA and the rate of resistance change (ΔR/R) were substantially identical to those in the known example.

What is claimed is:

1. A tunneling magnetic sensing element comprising:
    a pinned magnetic layer;
    an insulating barrier layer; and
    a free magnetic layer, disposed in that order from the bottom, the magnetization direction of the pinned magnetic layer being pinned, the other functioning as a free magnetic layer, and the magnetization direction of the free magnetic layer changing in response to an external magnetic field, wherein the pinned magnetic layer has a multilayered ferrimagnetic structure and includes
        a first magnetic sublayer,
        a nonmagnetic intermediate sublayer, and
        a second magnetic sublayer, disposed in that order from the bottom, wherein the second magnetic sublayer has a multilayered structure and includes
            at least one second insertion subsublayer composed of Ta and having an average thickness of 1 Å to 3 Å, and
            upper and lower ferromagnetic subsublayers, the second insertion subsublayer being disposed between the upper and lower ferromagnetic subsublayers,
    wherein the pinned magnetic layer, the insulating barrier layer, and the free magnetic layer are successively stacked in that order from the bottom, and
    wherein a thickness of the upper magnetic subsublayer is larger than a thickness of the lower magnetic subsublayer.

2. The tunneling magnetic sensing element according to claim 1, wherein the at least one second insertion subsublayer is only a single subsublayer, and the average thickness of the upper ferromagnetic subsublayer disposed on the second insertion subsublayer is larger than the lower ferromagnetic subsublayer disposed under the second insertion subsublayer, or wherein the at least one second insertion subsublayer comprises a plurality of subsublayers, and the average thickness of the upper ferromagnetic subsublayer disposed on the uppermost second insertion subsublayer is larger than the lower ferromagnetic subsublayer disposed under the lowermost second insertion subsublayer.

* * * * *